United States Patent [19]

Tanabe et al.

[11] Patent Number: 4,777,149

[45] Date of Patent: Oct. 11, 1988

[54] METHOD OF MANUFACTURING POWER MOSFET

[75] Inventors: Hirohito Tanabe, Fujisawa; Yu Ohata, Tokyo; Kazuaki Suzuki, Kawasaki; Yukiharu Miwa, Yokohama; Yoshihito Nakayama, Kawasaki, all of Japan

[73] Assignee: Kabushiki Kaisha Toshiba, Kanagawa, Japan

[21] Appl. No.: 136,770

[22] Filed: Dec. 22, 1987

Related U.S. Application Data

[62] Division of Ser. No. 661,463, Oct. 16, 1984.

[30] Foreign Application Priority Data

Oct. 17, 1983 [JP] Japan .................. 58-192310

[51] Int. Cl.⁴ .......................... H01L 21/383
[52] U.S. Cl. ...................... 437/142; 357/58; 437/913
[58] Field of Search ............. 437/142, 913; 357/58

[56] References Cited

U.S. PATENT DOCUMENTS

| | | | |
|---|---|---|---|
| 3,440,113 | 4/1969 | Wolley | 357/64 X |
| 3,640,783 | 2/1972 | Bailey | 437/142 |
| 3,947,864 | 3/1976 | Yatsuo | 357/39 |
| 4,398,339 | 8/1983 | Blanchard et al. | 357/23.4 |

FOREIGN PATENT DOCUMENTS

| | | |
|---|---|---|
| 0071916 | 7/1982 | European Pat. Off. |
| 3306974 | 9/1983 | German Democratic Rep. |
| 2133212 | 7/1984 | United Kingdom |

OTHER PUBLICATIONS

Clemente et al., "A Chopper for Motor Speed Control Using Parallel Connected Power Hexfets", *Int. Rectifier Hexfet Databook*, 1981, pp. 72–83.

Nasshibian et al., *IEEE Trans. on Electron Devices*, vol. ED-27, No. 9, Sep. 1980, pp. 1757–1761.

Nassibian et al., *IEEE Trans. on Electron Devices*, vol. ED-28, Sep. 1981, pp. 1014–1017.

*Primary Examiner*—George T. Ozaki
*Attorney, Agent, or Firm*—Foley & Lardner, Schwartz, Jeffery, Schwaab, Mack, Blumenthal & Evans

[57] ABSTRACT

In a power MOS FET and the method of manufacturing such FET, in which a material, such as platinum, having a small resistivity compensation effect is diffused as a lifetime killer into the vicinity of a PN diode junction formed by the drain region and the base region. The diffusion is made through an opening formed in a covering insulator layer. An example of the lifetime killer is platinum and the preferable temperature range for diffusing platinum is not higher than 900°C.

2 Claims, 4 Drawing Sheets

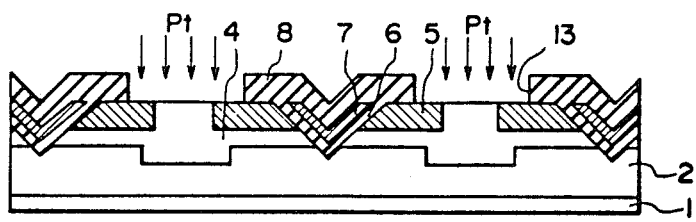
FIG.6(a)
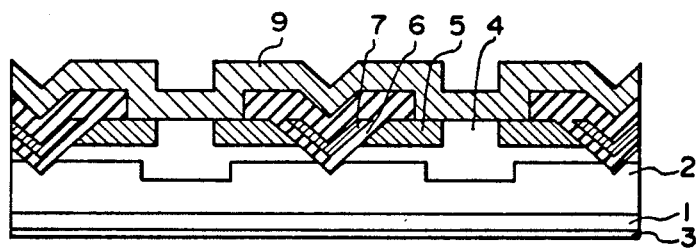
FIG.6(b)
FIG.7
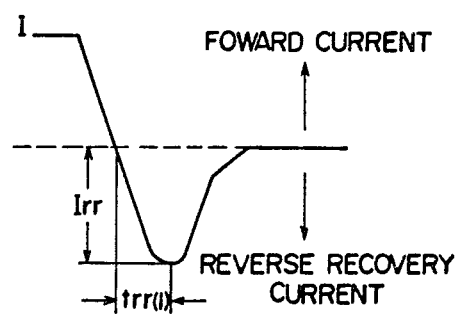

METHOD OF MANUFACTURING POWER MOSFET

This application is a division of application Ser. No. 661,463, filed Oct. 16, 1984.

BACKGROUND OF THE INVENTION

The present invention relates to a power metal oxide semiconductor type field effect transistor (hereinafter referred to as MOS FET), and more particularly to an improvement in a characteristic of a diode included in or internal to such a power MOS FET.

Generally, as a large power MOS FET for a large current and/or a high voltage, various types of double diffusion type MOS FETs (abbreviated as D-MOS FETs, which include as their special forms V-MOS FET and U-MOS FET) have been used. In any of the types, a parasitic diode is inherently formed due to the physical construction of the D-MOS FET.

FIG. 1 is a sectional view showing a typical D-MOS FET. In the figure, reference numeral 1 denotes an N+ type high concentration silicon substrate, and reference numeral 2 denotes an N− type low concentration silicon epitaxial layer. A drain region of the MOS FET is formed by both of the layers 1 and 2. Reference numeral 3 denotes a drain electrode. Further, a diffusion region 4 with a P type impurity diffused is formed within the N− type epitaxial layer 2, and an N+ type impurity diffused region 5 is formed within the P type impurity diffused region 4, wherein the P type impurity diffused region 4 constitutes a base region for a channel portion while the N+ impurity diffused region 5 constitutes a source region. Provided above the N− type epitaxial layer 2 and the channel portion base region is a gate insulator layer 6 extending up to a portion of the surface of the source region 5, and a gate electrode 7 is formed above the gate insulator layer 6. Further, an interlayer insulator layer 8 and a source electrode layer 9 are formed in superposition with each other in the stated order on the gate electrode 7. The source electrode layer 9 is connected to the source region 5 and the base region 4 as well. The above-mentioned V-MOS FETs and U-MOS FETs have principally the same construction, although they differ in form.

An equivalent circuit for the power MOS FET constructed as above is shown in FIG. 2. In FIG. 2, a drain electrode D corresponds to the N+ type silicon substrate 1 and the N− type epitaxial layer 2, a source electrode S corresponds to the N+ type impurity diffused region 5, and a gate electrode G corresponds to the gate electrode 7, respectively in FIG. 1. The diode D1 shown in FIG. 2 is formed parasitically, the P type impurity diffused region 4 of FIG. 1 serving as an anode and the N− type epitaxial layer 2 serving as a cathode.

As described above, the power MOS FET includes a parasitic diode, so that when the FET is used in an inverter circuit for motor control, the parasitic diode can be utilized as a flywheel diode, with the result that separate flywheel diodes which had to be connected outside of the FET can be dispensed with, and hence the number of parts can be reduced. It has therefore been said that the power MOS FET has, in addition to the advantages such as a high switching speed, a high efficiency, a broad safely operating region, and a high resistance against breakage, a capability of reducing the number of parts and hence the cost.

However, it has been found that when such power MOS FETs are actually utilized in an inverter circuit shown in part in FIG. 3 for controlling a motor, the parasitic diode has a long reverse recovery time ($t_{rr}$) and a large power loss so that it cannot be used as a flywheel diode. The following is a detailed description on this point.

FIG. 3 shows a portion of an inverter circuit, in which two MOS FETs 1 and 2 are serially connected to each other, and a motor winding L is connected to the node connecting the MOS FETs 1 and 2. Control signals are input to the gates G1 and G2 of the MOS FETs 1 and 2 to control the conductions of the MOS FETs 1 and 2, and thus the winding L is excited to control the rotation of the motor.

When the MOS FET 2 is nonconductive, the load current $I_L$ flows as a flywheel current $I_{D1}$ passing through the internal diode $D_1$. However, when the MOS FET 2 is subsequently turned on, a current $I_T$ flows through the MOS FET 2 which is the sum of the load current $I_L$ and a reverse recovery current $I_D$ from the internal diode $D_1$. The load current $I_L$, flywheel current $I_{D1}$ of the internal diode $D_1$, current $I_T(=I_L+I_{D1})$ passing through the MOS FET 2, and the voltage $V_T$ applied to the MOS FET 2 vary with time as shown in FIG. 4. A hatched portion in the current $I_{D1}$ represents the reverse recovery current $I_D$, and the current $I_T$ flowing then is the sum of the on-time current $I_L$ and the current $I_D$.

As seen from FIG. 4, the reverse recovery current $I_D$ is very large, resulting in a large power loss in the MOS FET 2. The power loss becomes larger, with longer reverse recovery time ($t_{rr(1)}$) of the internal diode $D_1$, and the MOS FET 2 may therefore break down.

SUMMARY OF THE INVENTION

It is an object of the present invention to provide a power MOS FET which has a high speed internal flywheel diode formed inherently therein, the diode having a shorter reverse recovery time and hence a smaller power loss, and which is superior in breakage resistance and suitable for use in a motor control device, a switching regulator, a pulse width modulation (PWM) amplifier output device.

The present invention has been accomplished through the following findings: When a high concentration gold diffusion method, which is generally employed as a means for shortening a reverse recovery time of a diode, is adopted to a power MOS FET, the method can be effective in forming a life time killer in the diode region. However, a resistivity compensation effect is so strong that the resistivity of a low concentration silicon epitaxial layer is much increased, resulting in an increase of a drain resistance and an adverse effect upon the device resistance. Contrary to the above, if a material having a small resistivity compensation effect, such as platinum, is diffused in the vicinity of a PN junction formed by a drain region and a base region, the increase of a drain resistance is suppressed, while at the same time the reverse recovery time can be shortened.

The characteristic feature of the MOS FET according to the present invention, therefore, resides in that a material having a small resistivity compensation effect, such as platinum, is made present as a lifetime killer in the diode region adjacent a diode junction.

The method of manufacturing a MOS FET according to the present invention is characterized in that it includes a process step of diffusing the lifetime killer through an opening formed by selectively removing a portion of a covering insulator layer on the base region and the source region. By virtue of the manufacturing method according to the present invention, it is possible to obtain the MOS FET which is excellent in the variation of $V_{th}$, the variation of breakdown voltage waveform, the increase of leakage current, and the like. An even superior MOS FET can be obtained by a method in which the lifetime killer is diffused at a temperature of not higher than 900° C.

BRIEF DESCRIPTION OF THE DRAWINGS

In the accompanying drawings:

FIGS. 6(a) to 6(b) are sectional views illustrating the D-MOS FET at various manufacturing process steps according to a second embodiment of the present invention;

FIG. 7 is a waveform diagram showing a reverse recovery current of an internal diode formed in a MOS FET.

DETAILED DESCRIPTION OF THE PREFERRED EMBODIMENTS

Figure 1:
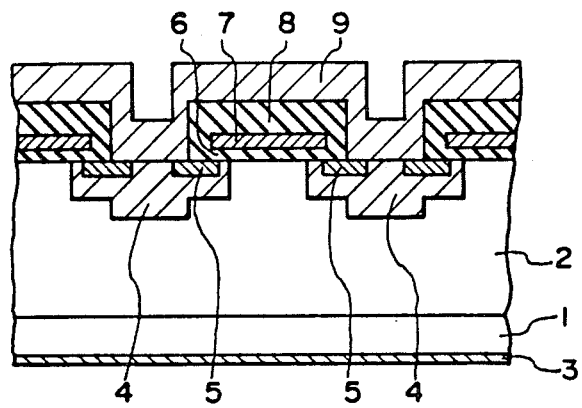
FIG. 1 is a sectional view of a prior art D-MOS FET.
Figure 2:
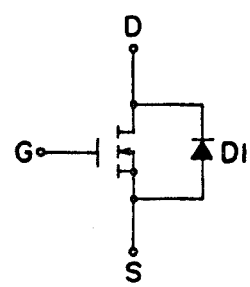
FIG. 2 is a circuit diagram showing an equivalent circuit of the D-MOS FET shown in FIG. 1.
Figure 3:
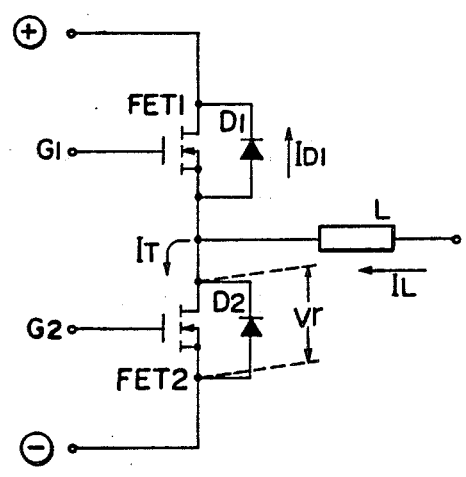
FIG. 3 is a circuit diagram of a portion of an inverter incorporating D-MOS FETs.
Figure 4:
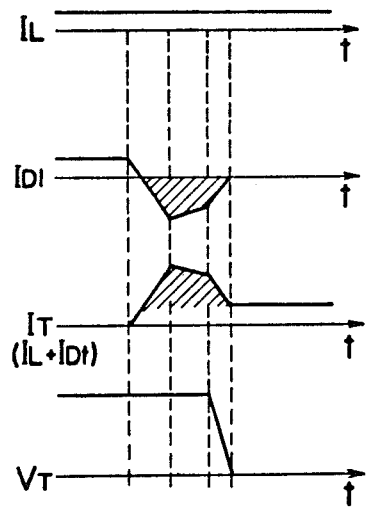
FIG. 4 is a diagram showing waveforms of the currents and voltages in the inverter of FIG. 3 during commutation.

The preferred embodiments according to the present invention will now be described with reference to FIGS. 5 and 6. In FIGS. 5 and 6, portions identified by the same reference numerals as in FIG. 1 denote, the identical or similar portions, and the description thereof is omitted.

Figure 5A:
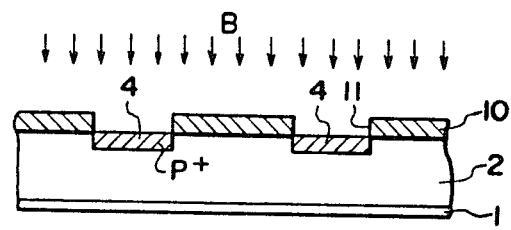
FIGS. 5(a) to 5(f) are sectional views illustrating the D-MOS FETs at various manufacturing process steps according to a first embodiment of the present invention.

FIGS. 5(a) to 5(f) show a manufacturing process of a D-MOS FET according to a first embodiment of the present invention. As shown in FIG. 5(a), an N$^-$ type epitaxial layer 2 having a thickness of 30 μm and a concentration of $6 \times 10^{14}/cm^3$ is formed on an N$^+$ type substrate 1 of a high concentration (of not less than $3 \times 10^{18}/cm^3$). The substrate is thereafter subjected to a thermal oxidation to form thereon an SiO$_2$ layer 10 of a thickness of 1 μm. Openings 11 are formed in the layer 10 by means of photolithography. Then, using the SiO$_2$ layer 10 as a mask, boron (B) is ion-implanted and diffused to form a P layer 4. The conditions of ion implantation are set such that the acceleration voltage is 40 keV and the dosage is $5 \times 10^{15}/cm^2$.

Figure 5B:
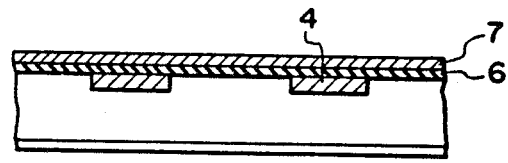

Next, the SiO$_2$ layer 10 is removed, and thermal oxidation is again performed to form a gate thermal oxidation layer 6 as shown in FIG. 5(b). Thereafter, by low pressure chemical vapor deposition, a polysilicon layer 7 is formed in superposition on the layer 6. The polysilicon layer 7 serves as a gate electrode.

Figure 5C:
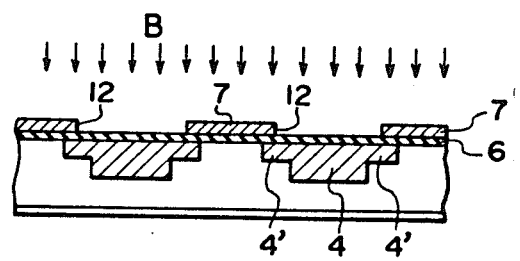
Figure 5D:
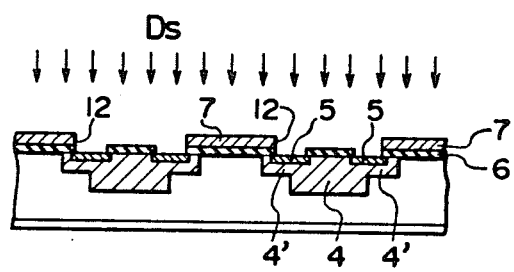

Next, as shown in FIG. 5(c), openings 12 larger than the openings 11 in FIG. 5(a) are formed in the polysilicon layer 7. Then, using the polysilicon as a mask, boron (B) is ion-implanted and diffused to form a channel portion base region 4'. Further, as shown in FIG. 5(d), the gate insulator layer 6 is partially removed so that a portion of the base region 4 is exposed and the remaining portion thereof is covered with the gate insulator layer, and arsenic (As) is ion-implanted and diffused to form a source region 5. The conditions of boron ion-implantation used this time include the acceleration voltage of 70 keV and the dosage of $2 \times 10^{14}/cm^2$. The conditions of arsenic ion-implantation include the acceleration voltage of 40 keV and the dosage of $5 \times 10^{15}/cm^2$.

Figure 5E:
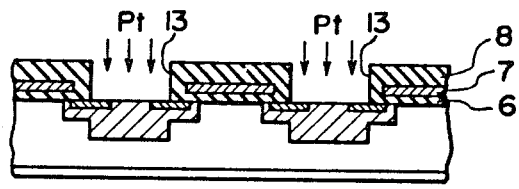

Next, as shown in FIG. 5(e), an interlayer insulator layer 8 having a thickness of 8000 Å is deposited, and openings 13 are formed therein by means of photolithography. Platinum (Pt) is diffused through these openings 13 into a diode region adjacent to or in the vicinity of the PN junction formed with the base region 4 and the epitaxial layer 2 at a temperature of not higher than 900° C.

Figure 5F:
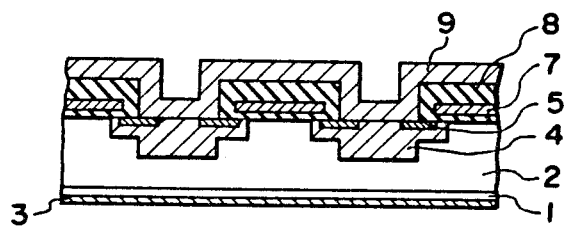

And, as shown in FIG. 5(f), an aluminum evaporated layer 9 is formed above the interlayer insulator layer 8 to serve as a source electrode, while vanadium (V), nickel (N), and gold (Au) are evaporated in the stated order on the lower or bottom surface of the N type substrate 1 to form a drain electrode 3 of a three-layer structure. The D-MOS FET of this first embodiment is thus obtained by the above-described manufacturing method of the present invention.

FIG. 6 shows another manufacturing process for producing V-MOS FET constituting a second embodiment of the invention. As shown in FIG. 6(a), a base region 4 and a source region 5 are formed in turn by diffusion into drain regions 1 and 2, and thereafter, the base region 4 and the source region 5 are partly etched to form a V-shaped groove upon which a gate insulator layer 6 and a polysilicon layer 7 are formed in superposition with each other. Further, an interlayer insulator layer 8 is formed on the surface of the substrate and openings 13 are formed in the interlayer polysilicon layer 8. Platinum is diffused through the openings 13 at a temperature of not higher than 900° C. Then, as shown in FIG. 6(b), a source electrode 9 and a drain electrode 3 are formed.

FIG. 7 is a waveform diagram illustrating the reverse recovery characteristic of an internal diode formed in a MOS FET, wherein a maximum reverse recovery current $I_{rr}$ and a reverse recovery time $t_{rr(1)}$ are shown.

Figure 8A:
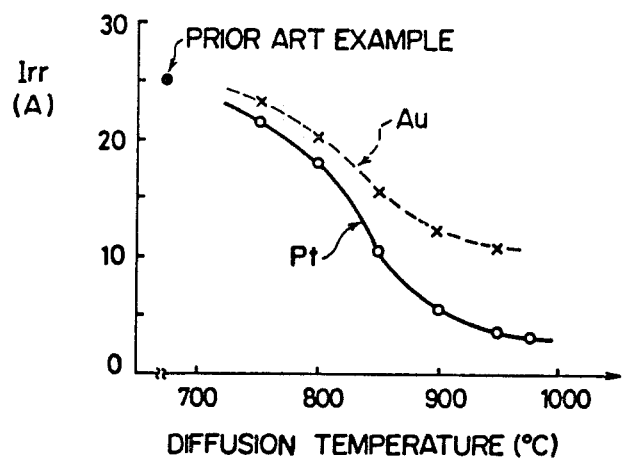
FIGS. 8A to 8C are graphs showing the maximum reverse recovery current $I_{rr}$, reverse recovery time $t_{rr(1)}$, and on-resistance, respectively, of the MOS FET according to the present invention, in comparison with the conventional MOS FET.
Figure 8B:
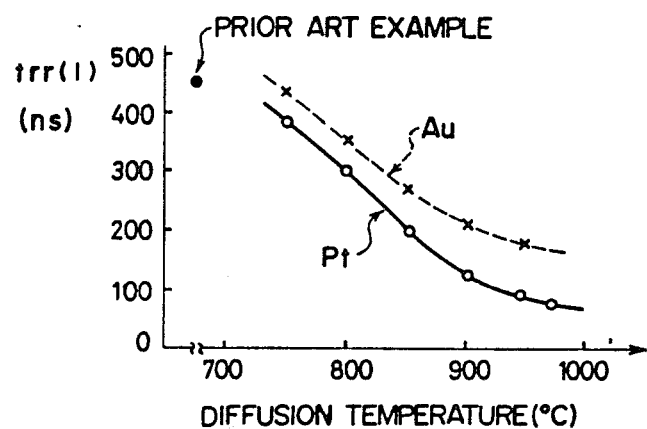
Figure 8C:
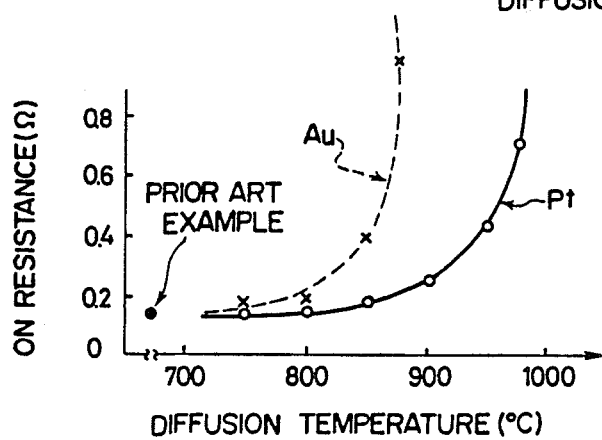

FIGS. 8A to 8C show the results of evaluation of the first embodiment described above, with the platinum diffusion temperature as a parameter. More particularly, FIG. 8A shows the maximum reverse recovery current $I_{rr}$, FIG. 8B shows the reverse recovery time $t_{rr(1)}$, and FIG. 8C shows the on-resistance of the MOS FET. In the figures, dark spots represent the results of examples in which neither platinum nor gold is diffused.

As seen from FIGS. 8A to 8C, $I_{rr}$ and $t_{rr(1)}$ are large where neither gold nor platinum are diffused. Where gold is diffused, $I_{rr}$ and $t_{rr(1)}$ can be made comparatively smaller, but the on-resistance abruptly increases.

According to the present invention, when diffusion temperature is at 900° C. or below, for example, at 850° C., $I_{rr}$ is reduced to 1/2.5 and $t_{rr(1)}$ is reduced to ½ compared with the prior art example. Moreover, there is little increase in the on-resistance.

As described above, the power MOS FET according to the present invention in which a material having a small resistivity compensation effect, such as, platinum, is diffused into the diode region, brings about a substantial improvement in the maximum reverse recovery current $I_{rr}$ and reverse recovery time $t_{rr}$ of the internal diode, retaining the on-resistance at the same degree as that of the prior art example. As a result, the power MOS FET according to the present invention can be suitably utilized in a motor control devices, switching regulators, PWM amplifier output devices and the like.

What is claimed is:

1. A method of manufacturing a power MOS type field effect transistor comprising the steps of:

forming, within a drain region made of a first conduction type semiconductor substrate, a base region of a second conduction type;

forming a source region of the first conduction type within said base region;

forming a gate insulator layer and a gate electrode above said base region between said drain region and said source region;

forming a covering insulator layer over the entire surface of said substrate including said gate electrode;

selectively removing a portion of said covering insulator layer above said base region and said source region to form an opening, said opening being located at a position displaced laterally from said gate electrode and above a PN junction formed by said drain region and said base region;

diffusing platinum through said opening as a lifetime killer into the vicinity of said PN diode junction, so that the concentration of platinum in the surface of said base region and said source region below said opening is highest;

forming a source electrode connected to a portion of said source region and a portion of said base region through said opening; and forming a drain electrode connected to said drain region.

2. A method as set forth in claim 1, wherein the temperature of platinum diffusion is not higher than 900° C.

* * * * *